United States Patent
Yamanobe (10) Patent No.: US 8,058,686 B2
(45) Date of Patent: Nov. 15, 2011

(54) SEMICONDUCTOR DEVICE INCLUDING A COLUMNAR INTERMEDIATE REGION AND MANUFACTURING METHOD THEREOF

(75) Inventor: Tomomi Yamanobe, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 312 days.

(21) Appl. No.: 12/232,571

(22) Filed: Sep. 19, 2008

(65) Prior Publication Data

US 2009/0096020 A1 Apr. 16, 2009

(30) Foreign Application Priority Data

Oct. 16, 2007 (JP) ................. 2007-268778

(51) Int. Cl.
*H01L 29/66* (2006.01)

(52) U.S. Cl. ........ 257/331; 257/330; 257/332; 438/270; 438/272; 438/273; 438/587

(58) Field of Classification Search ........... 257/E27.096, 257/E29.118, E29.274, E29.313, E29.318, 257/E29.262, 242, 329, E21.41, 331, 330, 257/332, 334, 135; 438/137, 156, 173, 192, 438/206, 212, 270, 272, 273, 275, 276, 278, 438/588, 587, 136
See application file for complete search history.

(56) References Cited

U.S. PATENT DOCUMENTS

| | | | | |
|---|---|---|---|---|
| 4,642,674 A | * | 2/1987 | Schoofs | 257/341 |
| 6,566,708 B1 | * | 5/2003 | Grover et al. | 257/330 |
| 7,372,100 B2 | * | 5/2008 | Saito | 257/329 |

FOREIGN PATENT DOCUMENTS

JP 2003-318397 11/2003

\* cited by examiner

*Primary Examiner* — Ha Tran T Nguyen
*Assistant Examiner* — Thanh Y Tran
(74) *Attorney, Agent, or Firm* — Rabin & Berdo, PC (57) ABSTRACT

A semiconductor device includes field effect transistors, each having a semiconductor layer formed on a major surface of a semiconductor substrate, a base region formed in a surface layer portion of a semiconductor layer, a source region formed in a surface layer portion of the base region, a source electrode formed on the base region and the source region, a gate electrode formed on the semiconductor layer and the base region via a gate insulating film interposed therebetween, and a drain electrode formed on a back surface of the semiconductor substrate, and which are placed side by side. A columnar intermediate region is formed in its corresponding predetermined region of the surface layer portion of the semiconductor layer placed below each gate electrode. Connection regions are formed in the surface layer portion of the semiconductor layer to contact the intermediate region and the base regions.

8 Claims, 10 Drawing Sheets

FIG. 15 even more fully from the following detailed description when taken in conjunction with the accompanying drawings are not based.

SEMICONDUCTOR DEVICE INCLUDING A COLUMNAR INTERMEDIATE REGION AND MANUFACTURING METHOD THEREOF

BACKGROUND OF THE INVENTION

The present invention relates to a semiconductor device which includes a plurality of vertical field effect transistors and wherein the field effect transistors are provided side by side with one another, and a manufacturing method thereof.

DMOS transistors each corresponding to a vertical field effect transistor have been known as semiconductor elements each of which enables large current to flow therethrough and is capable of being operated at a high voltage. The DMOS transistor allows current to flow between a source electrode formed on a major surface of a semiconductor substrate and a drain electrode formed on a back surface of the semiconductor substrate. A P-type base region is formed in its corresponding surface layer portion on the major surface side of the N-type semiconductor substrate, and an N-type source region is formed in its corresponding surface layer portion of the P-type base region. A source electrode is formed so as to contact the P-type base region and the N-type source region. A gate electrode is formed over the P-type base region through a gate insulating film interposed therebetween. When a positive electrode is applied to the gate electrode, an inversion-type channel is formed in its corresponding surface layer of the P-type base region. The current flows from the semiconductor substrate to the N-type source region and the source electrode via the channel. Since no channel is formed when the positive voltage is not applied to the gate electrode, no current flows. When the positive voltage is not applied to the gate electrode, a reverse bias is applied to a PN junction between the P-type base region and the N-type semiconductor substrate due to the voltage applied between the source and drain electrodes, so that a depletion layer spreads. The voltage applied between the source electrode and the drain electrode is applied to the depletion layer, but not applied to the gate insulating film. Therefore, a high breakdown voltage can be realized (refer to, for example, a patent document 1 (Japanese Unexamined Patent Publication No. 2003-318397)).

In each DMOS transistor referred to above, the depletion layer spreads due to the reverse bias applied to the PN junction between the P-type base region and the N-type semiconductor substrate. The voltage between the source and drain electrodes is applied to the depletion layer, but not applied to the gate insulating film. Since the DMOS transistor allows current to flow in the direction vertical to the semiconductor substrate, it is possible to cause large current to flow by providing a large number of the DMOS transistors side by side. In this case, the resistance of a current flowing region can be reduced by spreading or expanding the interval between the DMOS transistors, thus making it possible to cause more current to flow. On the other hand, when the interval between the DMOS transistors is spread, such a region that the depletion layer that spreads from the PN junction between the P-type base region and the N-type semiconductor substrate is not connected to its corresponding depletion layer that spreads from a PN junction of the adjoining DMOS transistor appears. Since the voltage between the source and drain electrodes is applied to the gate insulating film in the region in which the depletion layers are not connected to each other, a breakdown voltage is reduced. It is feared that no depletion layers are connected to each other particularly in a region increasing with distance from P-type base regions, such as a region surrounded by at least three DMOS transistors adjacent to one another, thus causing a reduction in breakdown voltage.

SUMMARY OF THE INVENTION

The present invention has been made in view of the foregoing points. It is an object of the present invention to provide a semiconductor device capable of preventing a reduction in breakdown voltage without depletion layers spread from adjoining vertical field effect transistors being connected to one another.

According to one aspect of the present invention, for attaining the above object, there is provided a semiconductor device comprising a plurality of field effect transistors each of which includes a semiconductor substrate of a first conductivity type, a semiconductor layer of the first conductivity type formed over a major surface of the semiconductor substrate and higher in resistance than the semiconductor substrate, a base region of a second conductivity type formed in a predetermined region of a surface layer portion of the semiconductor layer, a source region of the first conductivity type formed in a predetermined region of a surface layer portion of the base region, a source electrode formed so as to contact the base region and the source region, a gate electrode formed over the semiconductor layer and the base region through a gate insulating film interposed therebetween, a drain electrode formed over a back surface of the semiconductor substrate, and which are provided side by side with one another; a columnar intermediate region of a second conductivity type formed in a predetermined region of the surface layer portion of the semiconductor layer placed below each gate electrode; and connection regions of the second conductivity type respectively formed in predetermined regions of the surface layer portion of the semiconductor layer so as to contact the intermediate region and the base regions.

According to another aspect of the present invention, for attaining the above object, there is provided a method for manufacturing a semiconductor device, comprising the steps of forming a semiconductor layer of a first conductivity type higher in resistance than a semiconductor substrate of the first conductivity type over a major surface of the semiconductor substrate, forming each of base regions of a second conductivity type in a predetermined region of a surface layer portion of the semiconductor layer, forming each of source regions of the first conductivity type in a predetermined region of a surface layer portion of the base region, forming each of source electrodes so as to contact the base region and the source region, forming each of gate electrodes over the semiconductor layer and the base region through a gate insulating film interposed therebetween, forming a drain electrode over a back surface of the semiconductor substrate, forming a columnar intermediate region of a second conductivity type in a predetermined region of the surface layer portion of the semiconductor layer placed below each gate electrode, and forming connection regions of the second conductivity type in predetermined regions of the surface layer portion of the semiconductor layer so as to contact the intermediate region and the base regions.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
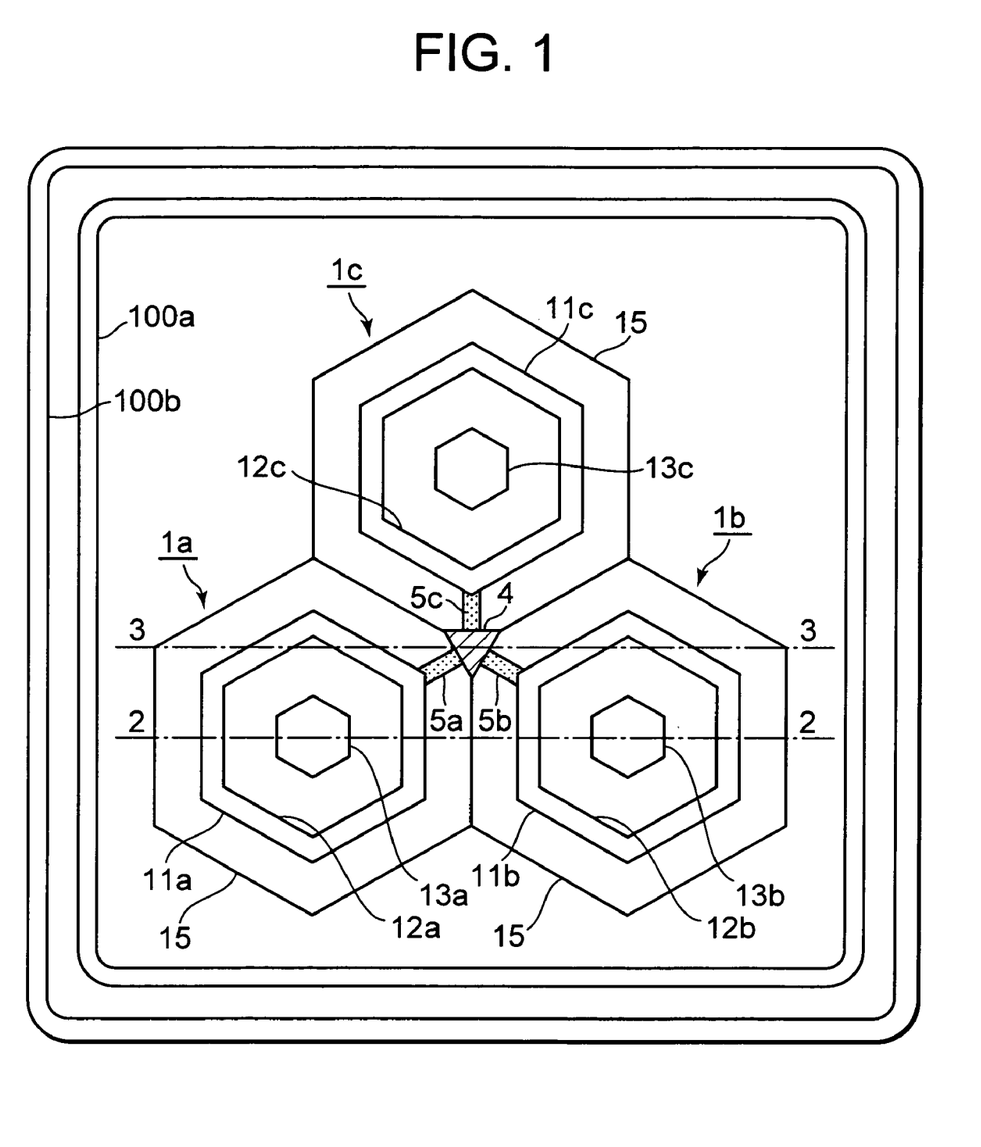
FIG. 1 is a plan view showing a structure of a semiconductor device illustrative of one embodiment of the present invention.

FIG. 1 is a plan view showing a structure of one embodiment illustrative of a semiconductor device according to the present invention. The semiconductor device comprises three field effect transistors 1a through 1c. FLRs (Field Limiting Rings) 100a and 100b are formed so as to surround the field effect transistors 1a through 1c. Planar shapes of a base region 11a, a source region 12 and a source electrode 13a of the field effect transistor 1a are respectively hexagonal. Incidentally, other field effect transistors 1b and 1c respectively also take planar shapes similar to the field effect transistor 1a. An intermediate region 4 is formed in the center of a region surround by the three field effect transistors 1a through 1c. A connection region 5a is formed so as to contact the intermediate region 4 and the base region 11a of the field effect transistor 1a. A connection region 5b is formed so as to contact the intermediate region 4 and a base region 11b of the field effect transistor 1b, and a connection region 5c is formed so as to contact the intermediate region 4 and a base region 11c of the field effect transistor 1c. Incidentally, while the intermediate region 4 is connected to the base regions 11a through 11c via the connection regions 5a through 5c respectively here, the intermediate region 4 may be connected to one of the base regions 11a through 11c via one of the connection regions 5a through 5c. As shown in FIG. 1, however, the intermediate region 4 may preferably be connected to all of the base regions 11a through 11c via the connection regions 5a through 5c.

Figure 2:
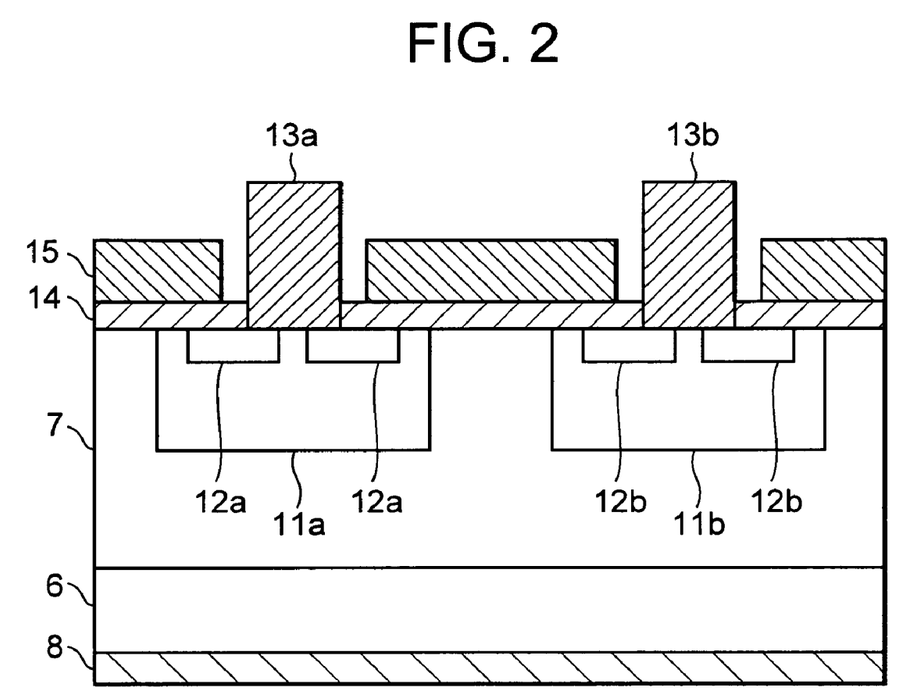
FIG. 2 is a sectional view illustrating the structure of the semiconductor device shown in FIG. 1.

FIG. 2 is a sectional view taken along line 2-2 of the semiconductor device shown in FIG. 1. An N⁻-type SiC epitaxial layer 7 lower in dopant concentration than an N⁺-type silicon carbide (hereinafter called "SiC") substrate 6 high in dopant concentration is formed over a major surface of the N⁺-type SiC substrate 6. P-type base regions 11a and 11b are formed in a surface layer portion of the N⁻-type SiC epitaxial layer 7. N⁺-type source regions 12a and 12b are respectively formed in surface layer portions of the P-type base regions 11a and 11b. The source electrode 13a is formed so as to contact the N⁺-type source region 12a and the P-type base region 11a. A source electrode 13b is formed so as to contact the N⁺-type source region 12b and the P-type base region 11b. Gate electrodes 15 are respectively formed over the N⁻-type SiC epitaxial layer 7 and the P-type base regions 11a and 11b via a gate insulating film 14. A drain electrode 8 is formed at the back surface of the N⁺-type SiC substrate 6.

Figure 3:
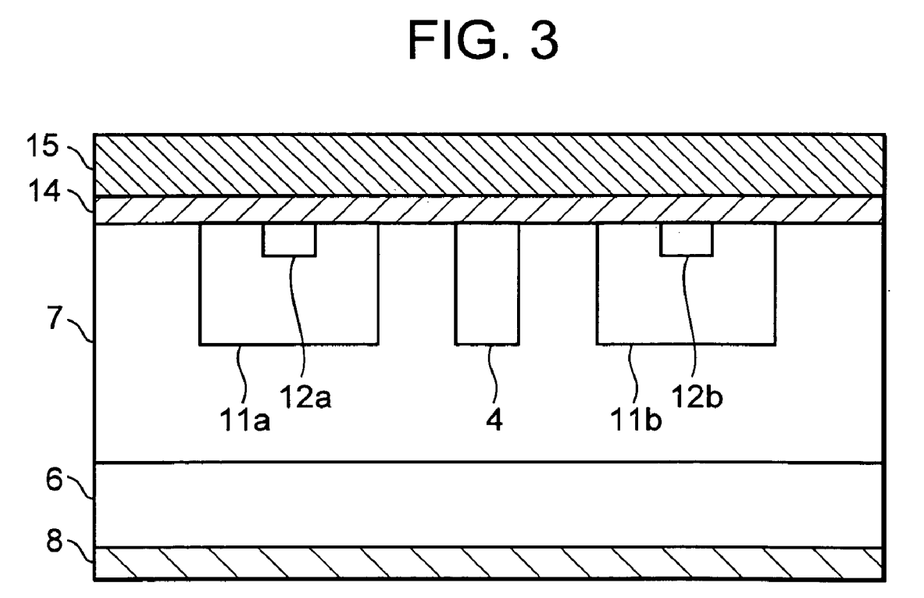
FIG. 3 is a sectional view depicting the structure of the semiconductor device shown in FIG. 1.

FIG. 3 is a sectional view taken along line 3-3 of the semiconductor device shown in FIG. 1. The N⁻-type SiC epitaxial layer 7 lower in dopant concentration than the N⁺-type SiC substrate 6 is formed over the major surface of the high-concentration N⁺-type SiC substrate 6. The P-type base regions 11a and 11b are formed in the surface layer portion of the N⁻-type SiC epitaxial layer 7. The columnar P-type intermediate region 4 is also formed in the surface layer portion of the N⁻-type SiC epitaxial layer 7. The N⁺-type source regions 12a and 12b are respectively formed in the surface layer portions of the P-type base regions 11a and 11b. The gate electrodes 15 are respectively formed over the N⁻-type SiC epitaxial layer 7 and the P-type base regions 11a and 11b via the gate insulating film 14. The drain electrode 8 is formed at the back surface of the N⁺-type SiC substrate 6.

A process for manufacturing the semiconductor device shown in FIG. 1 will next be explained. FIGS. 4 through 8 respectively show the process for manufacturing the semiconductor device shown in FIG. 1.

Figure 4:
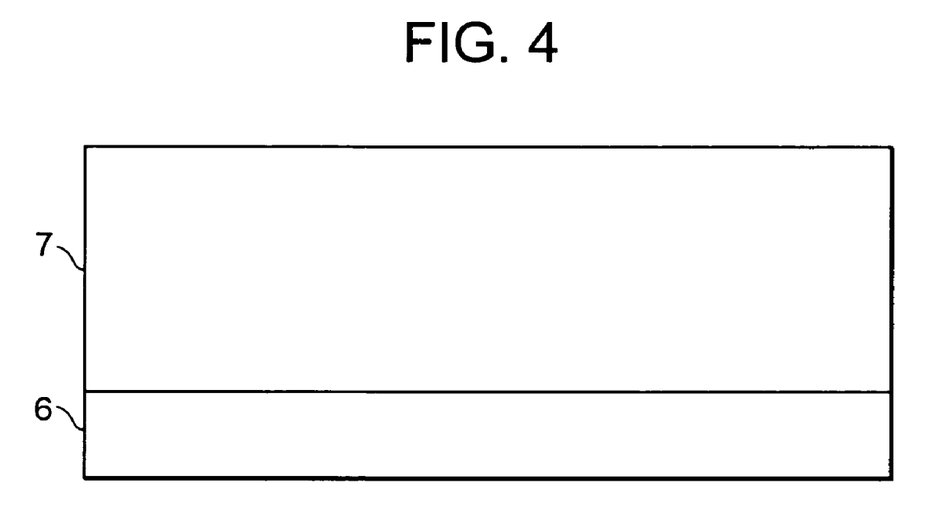
FIG. 4 is a sectional view showing a method for manufacturing the semiconductor device shown in FIG. 1.

In the semiconductor device manufacturing process, an N⁻-type SiC epitaxial layer 7 is first formed over a major surface of an N⁺-type SiC substrate 6 as shown in FIG. 4. An impurity concentration of the N⁻-type SiC epitaxial layer 7 ranges from $10^{14}$ to $10^{18}$ cm⁻³, for example. The thickness of the N⁻-type SiC epitaxial layer 7 ranges from 1 to 10 μ0 m, for example.

Figure 5:
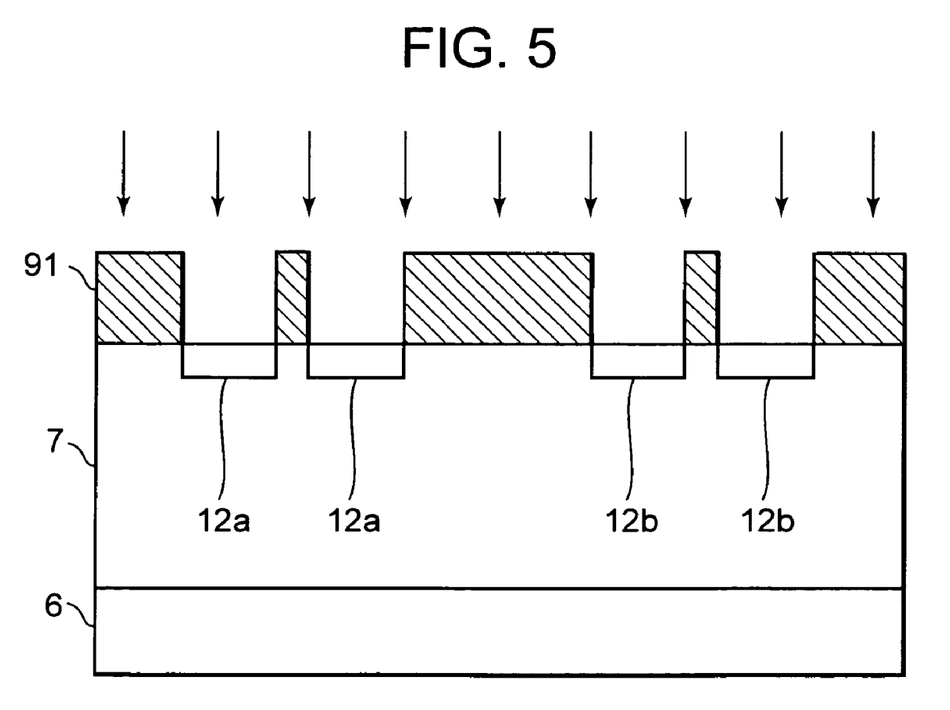
FIG. 5 is a sectional view illustrating the method shown in FIG. 1.

After the formation of the N⁻-type SiC epitaxial layer 7, an N-type impurity, e.g., phosphorus ions are implanted using a mask member 91 to form N⁺-type source regions 12a and 12b as shown in FIG. 5. The implantation of the N-type impurity is carried out at an accelerating voltage from 100 eV to 3 MeV under temperatures from 100° C. to 1000° C., for example. The total dose ranges from $10^{14}$ to $10^{16}$ cm⁻². Incidentally, nitrogen, arsenic and the like can also be used as the N-type impurity in addition to the phosphorus. The mask member 91 may be either a resist or a hard mask.

Figure 6:
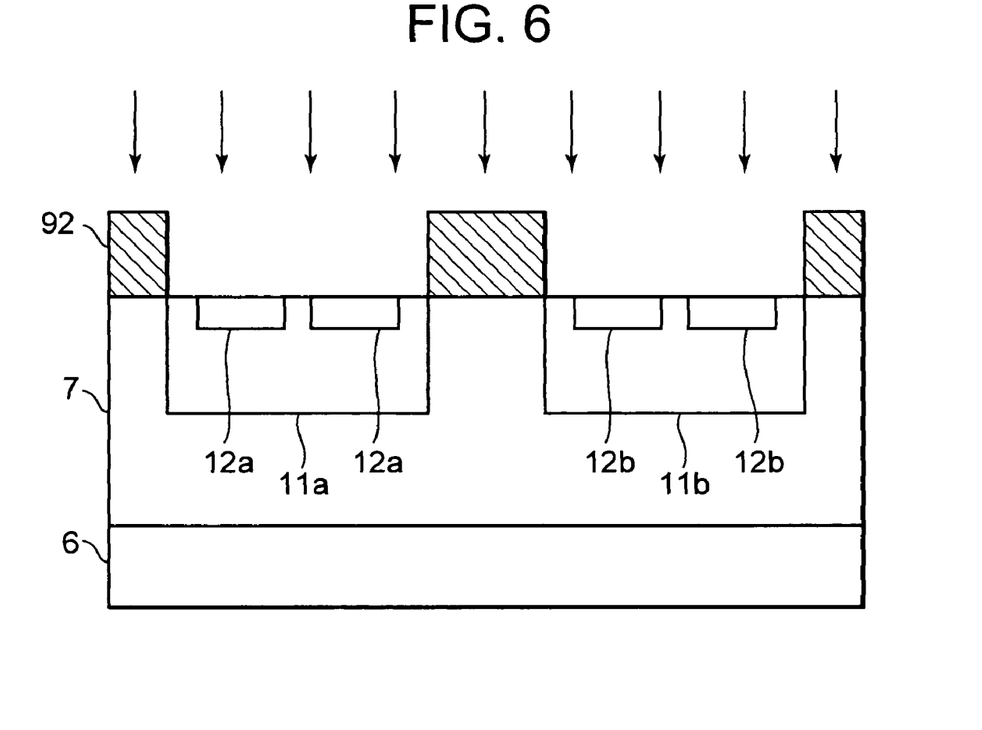
FIG. 6 is a sectional view depicting the method shown in FIG. 1.
Figure 7:
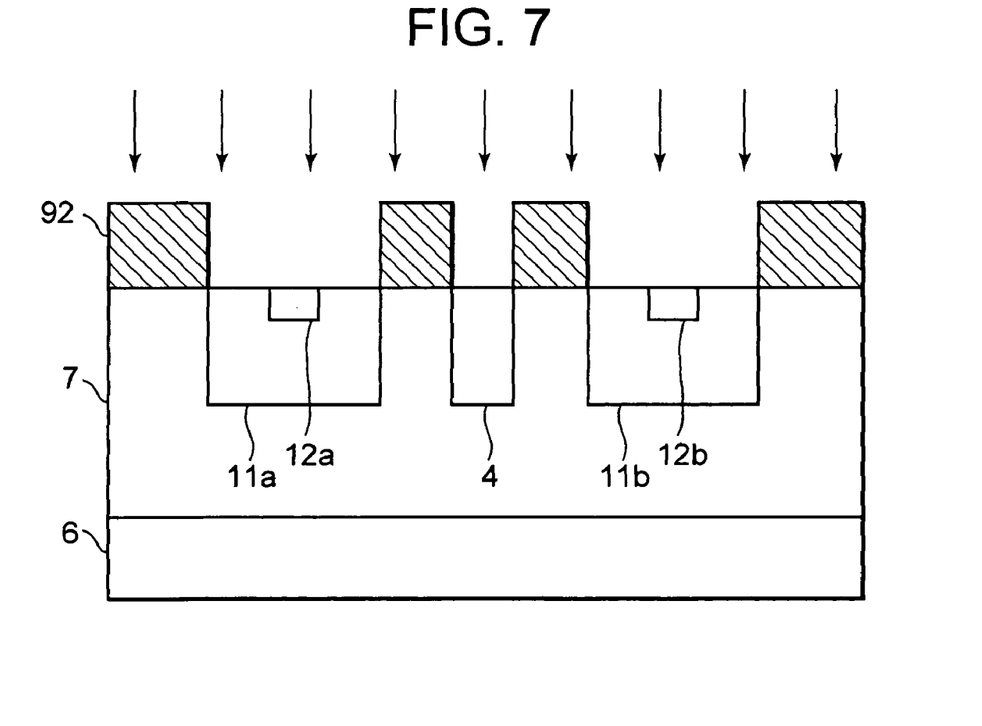
FIG. 7 is a sectional view showing the method shown in FIG. 1.

After the implantation of the N-type impurity, a P-type impurity, e.g., aluminium ions are implanted using a mask member 92 to form P-type base regions 11a and 11b as shown in FIG. 6. Incidentally, at this time, a P-type intermediate region 4 is also formed as shown in FIG. 7. Although not shown in the drawing, connection regions 5a through 5c are also formed. The implantation of the P-type impurity is carried out at an accelerating voltage from 100 eV to 5 MeV under temperatures from 100° C. to 1000° C., for example. The total dose ranges from $10^{12}$ to $10^{16}$ cm⁻², for example.

Incidentally, boron, gallium and the like may be used as the P-type impurity in addition to aluminum. The mask member 92 may be either a resist or a hard mask. At a step for implanting the P-type impurity, FLRs 100a and 100b may be formed simultaneously.

Figure 8:
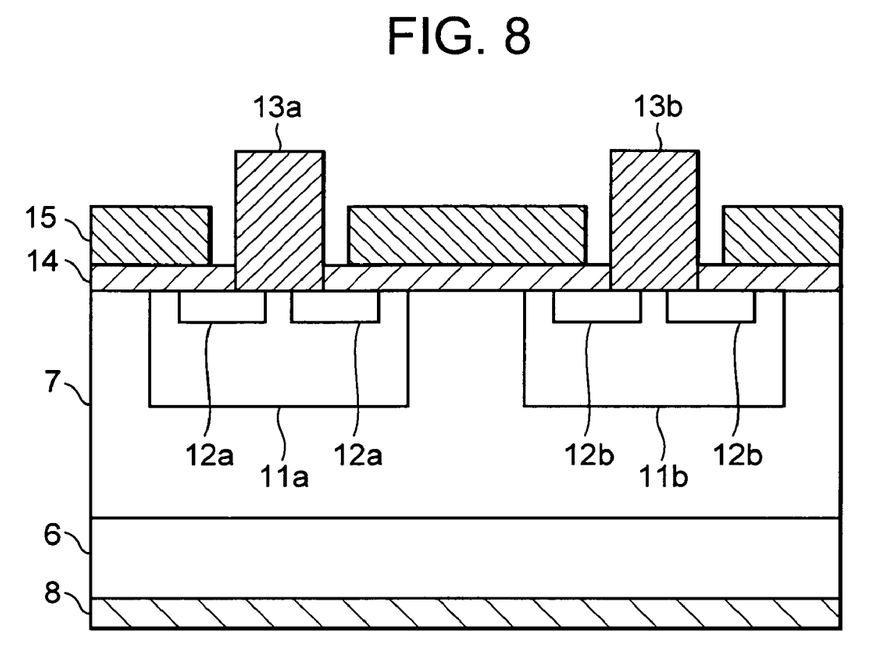
FIG. 8 is a sectional view illustrating the method shown in FIG. 1.

After the implantation of the P-type impurity, a heat treatment or annealing for activating the implanted impurity is performed under temperatures from 1000° C. to 1800° C., for example. After the heat treatment, a gate insulating film 14 is formed by, for example, thermal oxidation using 1200° C. or so as shown in FIG. 8. Gate electrodes 15 are formed over the gate insulating film 14 by polycrystalline silicon, for example. Further, source electrodes 13a and 13b and a drain electrode 8 are formed.

The semiconductor device is manufactured by the above manufacturing process. Incidentally, although the implantation of the N-type impurity has been conducted prior to the implantation of the P-type impurity, the implantation of the N-type impurity may be conducted after the implantation of the P-type impurity.

Figure 9:
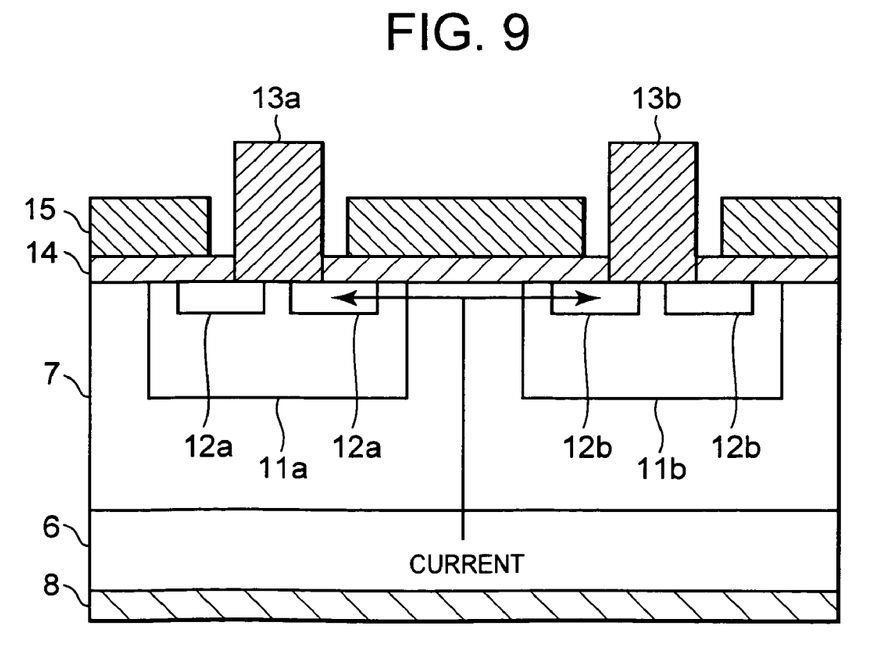
FIG. 9 is a sectional view showing the operation of the semiconductor device illustrated in FIG. 1.

The operation of the semiconductor device shown in FIG. 1 will next be explained. The operation of the semiconductor device held in an ON state is shown in FIG. 9. FIG. 9 is a sectional view taken along line 2-2 of the semiconductor device shown in FIG. 1. When a positive voltage is applied to the gate electrodes 15 in a state in which a voltage is being applied between the drain electrode 8 and the source electrodes 13a and 13b, inversion-type channels are formed in their corresponding surface layers of the P-type base regions 11a and 11b placed underneath the gate electrodes 15. When the channels are formed, the current flows from the drain electrode 8 to the source electrodes 13a and 13b via the N$^+$-type SiC substrate 6, N$^-$-type SiC epitaxial layer 7, inversion-type channels and N$^+$-type source regions 12a and 12b.

Figure 10:
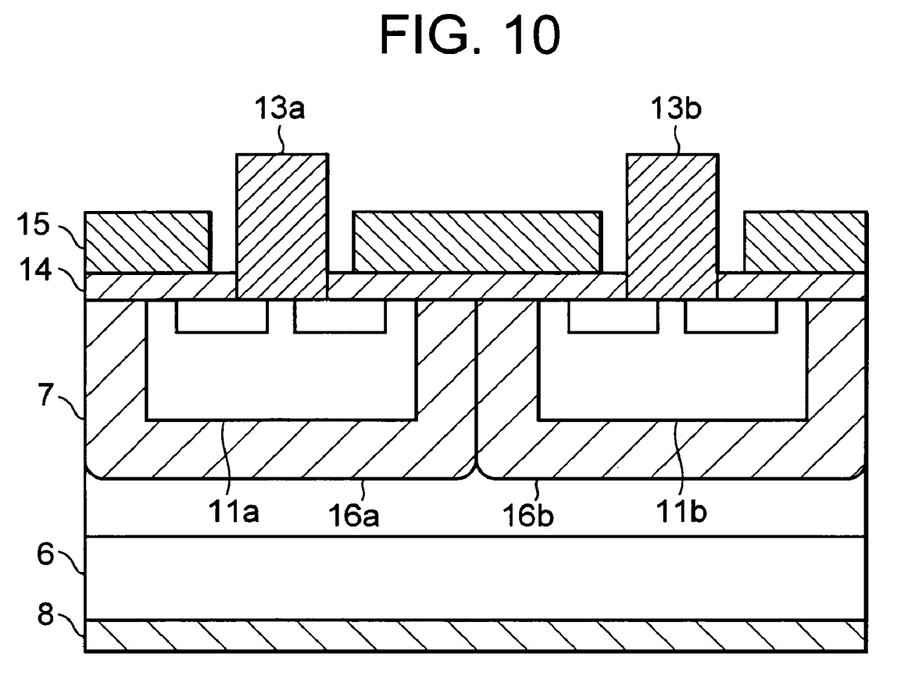
FIG. 10 is a sectional view illustrating the operation of the semiconductor device shown in FIG. 1.

The operation of the semiconductor device held in an OFF state is shown in FIG. 10. FIG. 10 is a sectional view taken along line 2-2 of the semiconductor device shown in FIG. 1. Since no channels are formed in the surface layers of the P-type base regions 11a and 11b placed underneath the gate electrodes 15 in a state in which no positive voltage is applied to the gate electrodes 15, no current flows. A reverse bias is applied to a PN junction between the P-type base regions 11a and 11b and the N$^-$-type SiC epitaxial layer 7 due to the voltage applied between the drain electrode 8 and the source electrodes 13a and 13b, so that depletion layers 16a and 16b spread. The depletion layer 16a that spreads from the P-type base region 11a of the field effect transistor 1a is connected to the depletion layer 16b that spreads from the P-type base region 11b of the field effect transistor 1b adjacent thereto. In this state, the voltage applied between the drain electrode 8 and the source electrodes 13a and 13b is applied to the depletion layers 16a and 16b, but not the gate insulating film 14. It is therefore possible to realize a high breakdown voltage.

Figure 11:
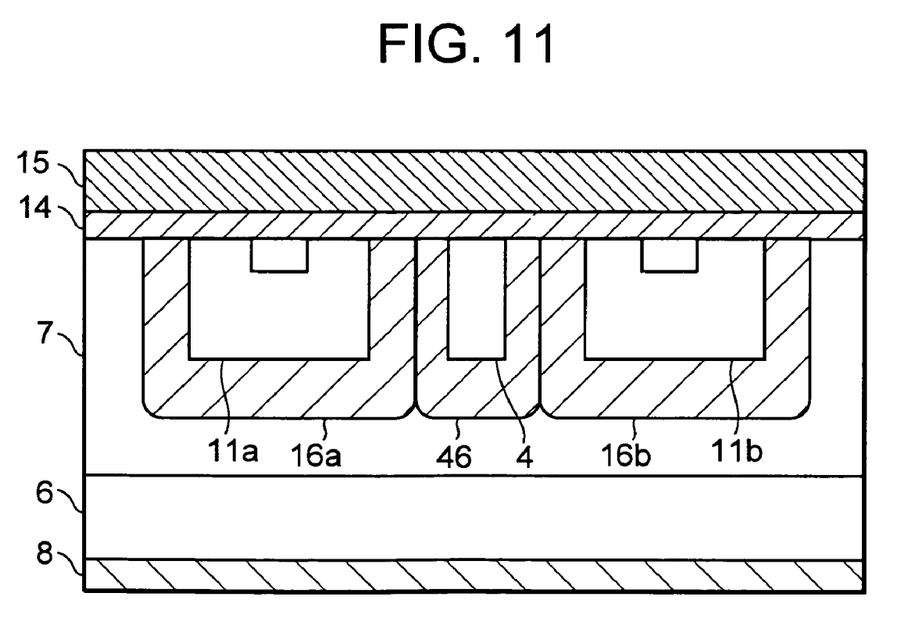
FIG. 11 is a sectional view showing the operation of the semiconductor device shown in FIG. 1.

The operation of the semiconductor device held in an OFF state is shown in FIG. 11. FIG. 11 is a sectional view taken along line 3-3 of the semiconductor device shown in FIG. 1. In a state in which no positive voltage is applied to the gate electrodes 15, a reverse bias is applied to the PN junction between the P-type base regions 11a and 11b and the N$^-$-type SiC epitaxial layer 7 due to the voltage applied between the drain electrode 8 and the source electrodes 13a and 13b, so that the corresponding depletion layers 16a and 16b spread. Since the intermediate region 4 is connected to the P-type base regions 11a and 11b via the connection regions 5a and 5b, a reverse bias is applied even to a PN junction between the intermediate region 4 and the N$^-$-type SiC epitaxial layer 7, so that a depletion layer 46 spreads. The depletion layer 16a that spreads from the P-type base region 11a of the field effect transistor 1a is coupled to the depletion layer 46 that spreads from the intermediate region 4. The depletion layer 16b that spreads from the P-type base region 11b of the field effect transistor 1b is coupled to the depletion layer 46 that spreads from the intermediate region 4. Thus, since the depletion layer 46 spreads from the intermediate region 4, the depletion layers can be connected even in the region surrounded by the three field effect transistors 1a through 1c increasing with distance from the P-type base regions 11a through 11c. With the connection of the depletion layers in this way, the voltage applied between the drain electrode 8 and the source electrodes 13a and 13b is applied to the depletion layers 16a and 16b and the depletion layer 46. Therefore, since no voltage is applied to the gate insulating film 14, a high breakdown voltage can be realized.

Figure 12:
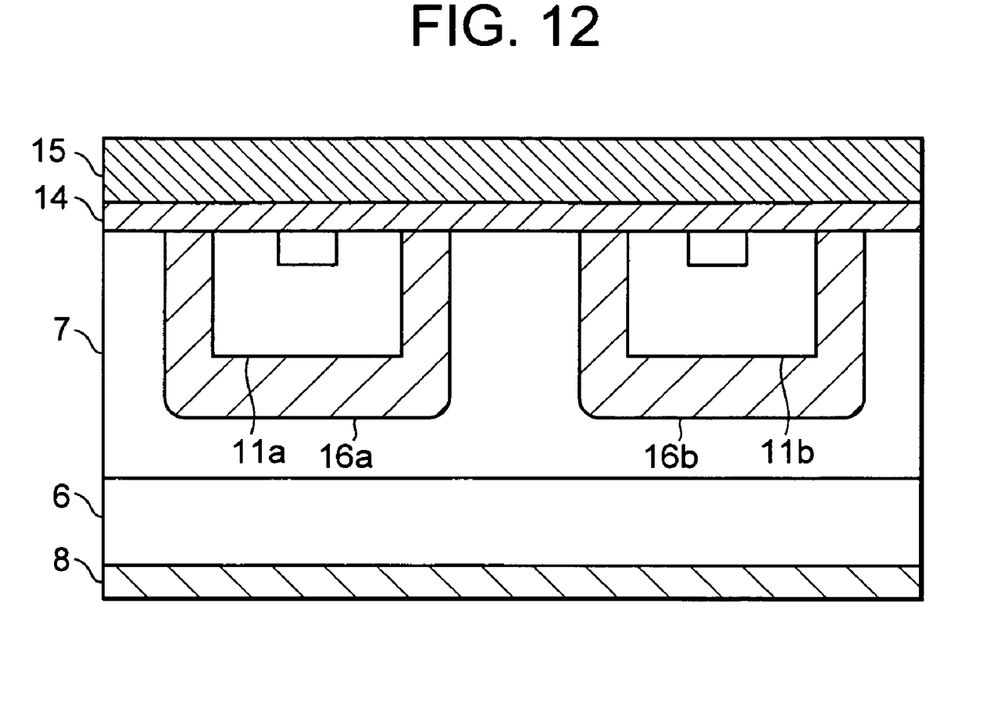
FIG. 12 is a sectional view showing the operation of a conventional semiconductor device.

On the other hand, the operation of the semiconductor device held in an OFF state at the time that no intermediate region 4 exists in the region surrounded by the three field effect transistors 1a through 1c, is shown in FIG. 12. In this case, the depletion layer 16a that spreads from the P-type base region 11a, and the depletion layer 16b that spreads from the P-type base region 11b are not coupled to each other in the region increasing with distance from the P-type base regions 11a and 11b. Since the voltage applied between the drain electrode 8 and the source electrodes 13a and 13b is applied to the gate insulating film 14 in this state, a breakdown voltage is lowered.

Thus, with the formation of the intermediate region 4 in the region surrounded by the three field effect transistors 1a through 1c, the depletion layer 46 spreads from the intermediate region 4 when the semiconductor device is in the OFF state, so that the depletion layer 46 is connected to the depletion layers 16a and 16b that spread from the P-type base regions 11a and 11b respectively. Therefore, since the voltage applied between the drain electrode 8 and the source electrodes 13a and 13b is applied to the depletion layers 16a and 16b and the depletion layer 46, and no voltage is applied to the gate insulating film 14, a high breakdown voltage can be realized.

Incidentally, although the shape of the intermediate region is set to a triangular prism here, it can also be set to a quadrangular prism, a circular cylinder or the like. When, however, the intermediate region is formed in the region surrounded by the three field effect transistors as shown in FIG. 1, a current flowing region can be spread out by bringing the shape of the intermediate region into the triangular prism. Therefore, the shape of the intermediate region is preferably taken as the triangular prism. The materials and conditions or the like mentioned here are illustrative only, and the present invention is not limited to it.

Figure 13:
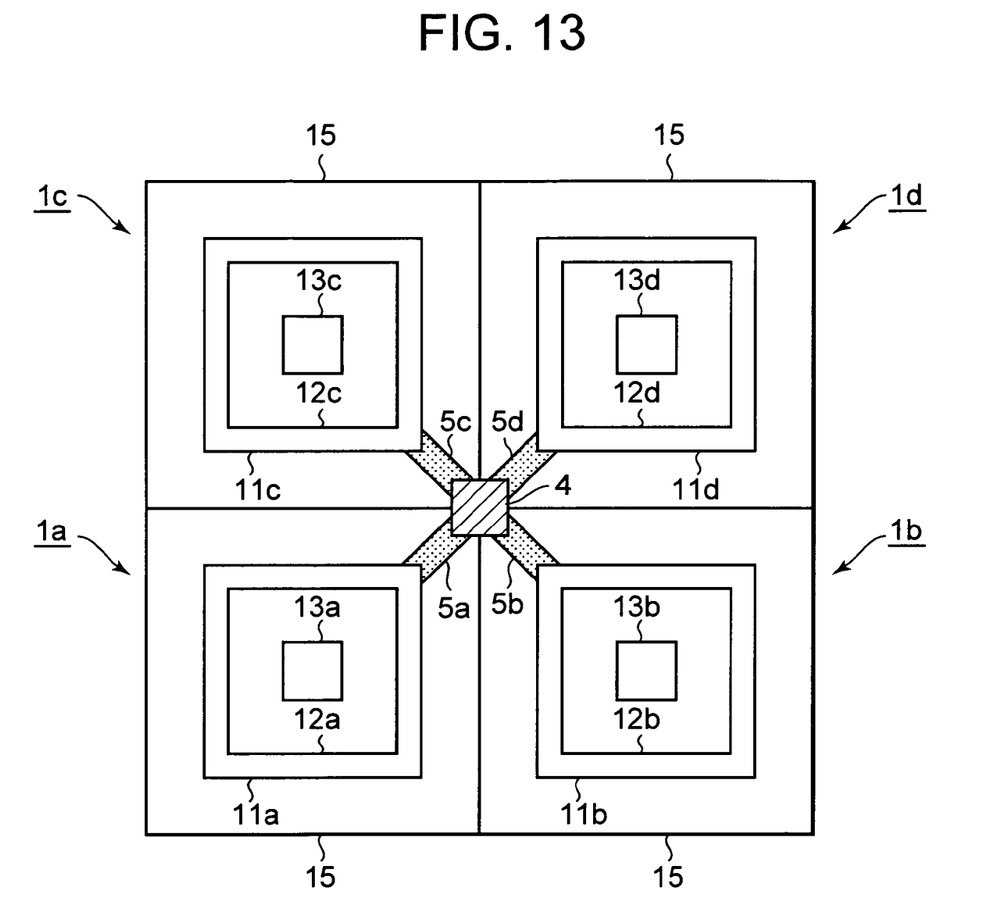
FIG. 13 is a plan view depicting a structure of a semiconductor device illustrative of another embodiment of the present invention.
Figure 14:
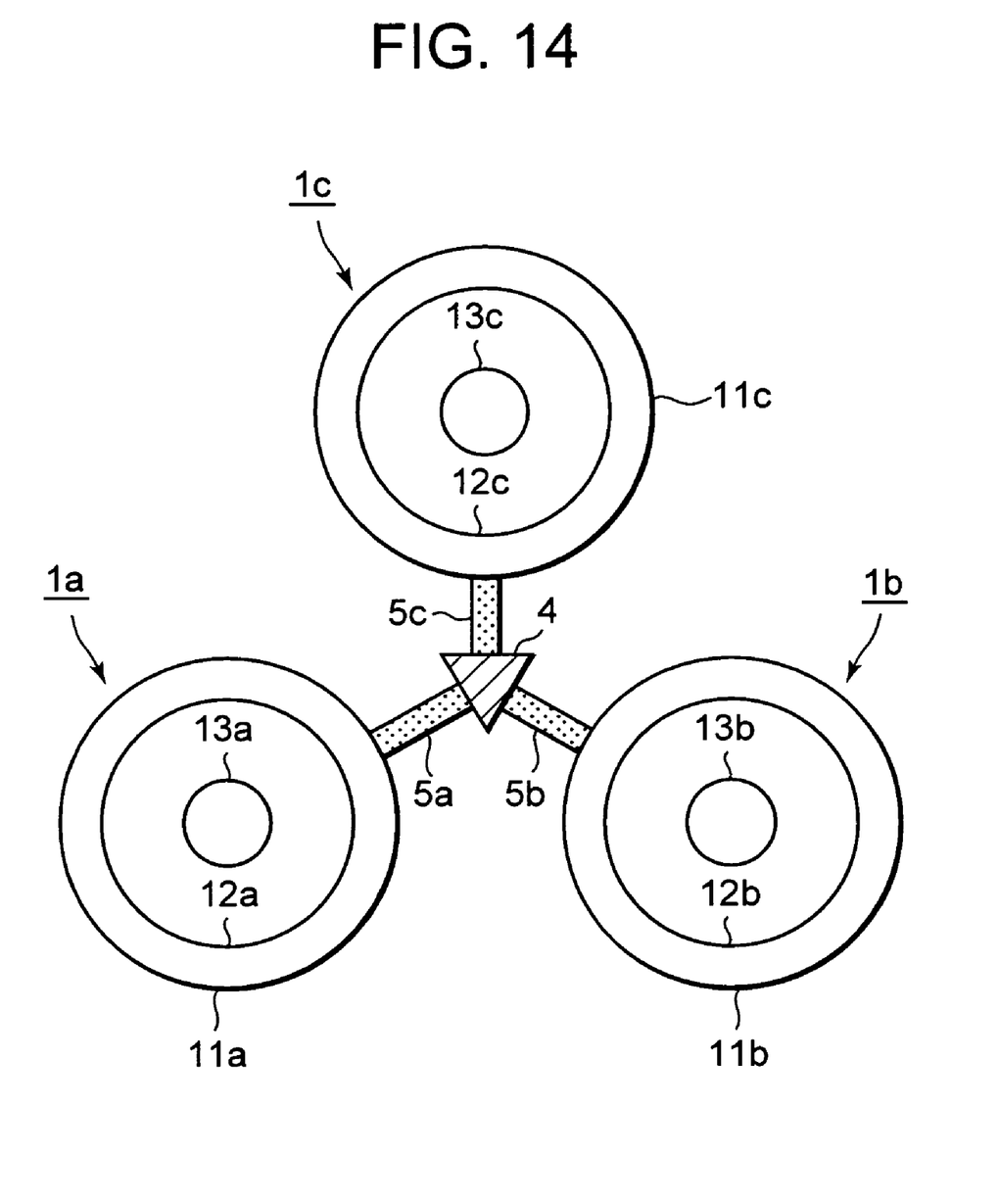
FIG. 14 is a plan view depicting a structure of a semiconductor device illustrative of a further embodiment of the present invention.
Figure 15:
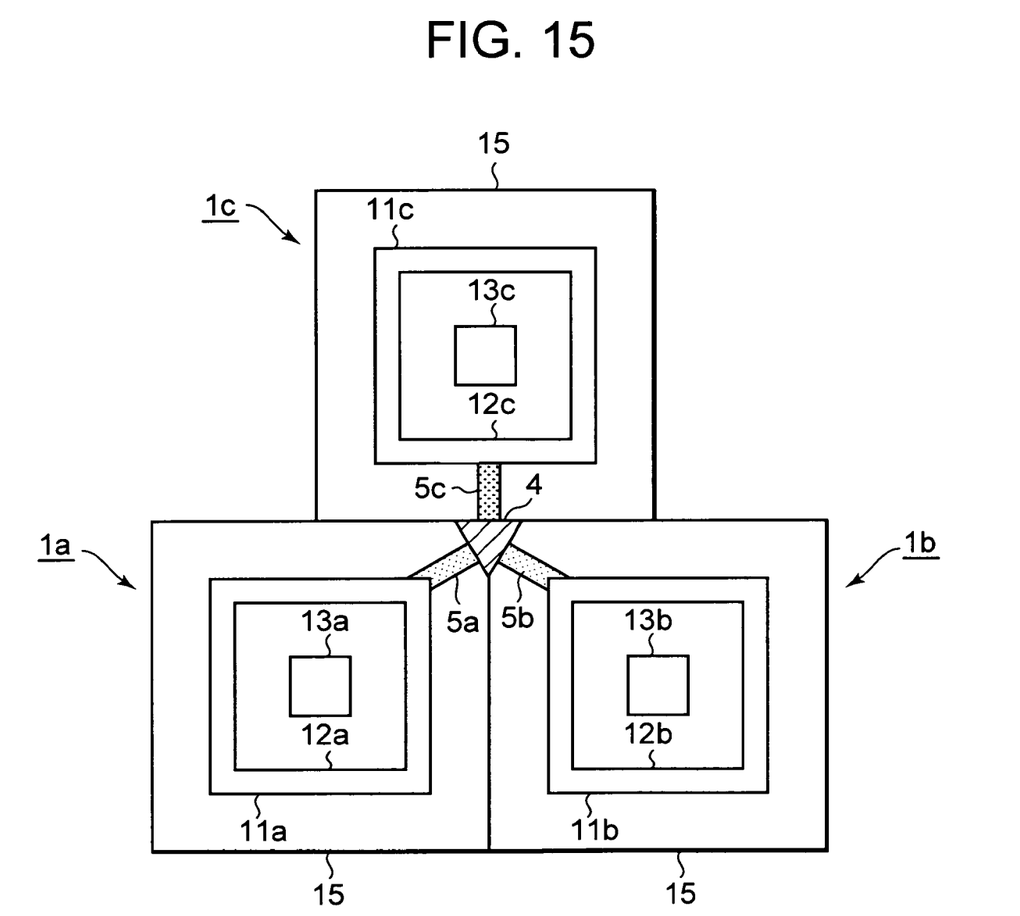
FIG. 15 is a plan view showing a structure of a semiconductor device illustrative of a still further embodiment of the present invention.0

Although the planar shapes of the base region, source region and source electrode of each field effect transistor are taken as hexagonal in the above embodiment, they can be taken as a quadrangle, a circular form and the like as shown in FIGS. 13 through 15.

Another semiconductor device shown in FIG. 13 comprises four field effect transistors 1a through 1d each having a base region, a source region and a source electrode whose planar shapes are quadrangular. An intermediate region 4 is formed in the center of a region surrounded by the four field effect transistors 1a through 1d. Connection regions 5a through 5d are formed so as to contact the intermediate region 4 and the base regions 11a through 11d.

A further semiconductor device shown in FIG. 14 comprises three field effect transistors 1a through 1c each having a base region, a source region and a source electrode whose planar shapes are circular. An intermediate region 4 is formed in the center of a region surrounded by the three field effect transistors 1a through 1c. Connection regions 5a through 5c are formed so as to contact the intermediate region 4 and the base regions 11a through 11c.

A still further semiconductor device shown in FIG. 15 comprises three field effect transistors 1a through 1c each having a base region, a source region and a source electrode whose planar shapes are quadrangular. An intermediate region 4 is formed in the center of a region surrounded by the three field effect transistors 1a through 1c. Connection regions 5a through 5c are formed so as to contact the intermediate region 4 and the base regions 11a through 11c.

Even in the case of the semiconductor devices wherein the field effect transistors shown in FIGS. 13 through 15 respectively have the base regions, source regions and source electrodes whose planar shapes are quadrangular and circular, depletion layers each of which spreads from the intermediate region are connected to their corresponding depletion layers each of which spreads from the base region, in a manner similar to the semiconductor device hexagonal in planar shape. Therefore, since the voltage applied between the drain and source electrodes is applied to the depletion layer and no voltage is applied to a gate insulating film, a high breakdown voltage can be realized.

According to each of the semiconductor devices of the present invention as described above, a columnar intermediate region is formed in a predetermined region of a surface layer portion of a semiconductor layer placed below each gate electrode. Connection regions are formed in predetermined regions of the surface layer portion of the semiconductor layer so as to contact the intermediate region and base regions. When the semiconductor device is in an OFF state, a depletion layer spreads even from the intermediate region and is connected to its corresponding depletion layer that spreads from a base region. Therefore, since the voltage between source and drain electrodes is applied to the depletion layer and no voltage is applied to a gate insulating film when the semiconductor device is in the OFF state, a breakdown voltage can be enhanced.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
   a plurality of field effect transistors each including
      a semiconductor substrate of a first conductivity type,
      a semiconductor layer of the first conductivity type formed over a major surface of the semiconductor substrate and higher in resistance than the semiconductor substrate,
      a base region of a second conductivity type formed in a predetermined region of a surface layer portion of the semiconductor layer,
      a source region of the first conductivity type formed in a predetermined region of a surface layer portion of the base region,
      a source electrode formed so as to contact the base region and the source region,
      a gate electrode formed over the semiconductor layer and the base region through a gate insulating film interposed therebetween, and
      a drain electrode formed over a back surface of the semiconductor substrate,
   said field effect transistors being provided side by side with one another;
   a columnar intermediate region of the second conductivity type formed in a predetermined region of the surface layer portion of the semiconductor layer placed below each gate electrode, the columnar intermediate region being disposed to not contact the base regions; and
   connection regions of the second conductivity type respectively formed in predetermined regions of the surface layer portion of the semiconductor layer so as to contact the intermediate region and the base regions.

2. The semiconductor device according to claim 1, wherein the plurality of field effect transistors includes at least three field effect transistors adjacent to one another, and the predetermined region of the surface layer portion of the semiconductor layer placed below each gate electrode corresponds to a central portion of a region surrounded by said at least three field effect transistors.

3. The semiconductor device according to claim 2, wherein the connection regions are formed so as to contact the intermediate region and the respective base regions of the mutually adjoining field effect transistors which surround the intermediate region.

4. The semiconductor device according to claim 2, wherein the intermediate region is surrounded by three field effect transistors adjacent to one another and is formed as a triangular prism.

5. The semiconductor device according to claim 4, wherein the semiconductor substrate and the semiconductor layer are comprised of silicon carbide.

6. The semiconductor device according to claim 1, wherein each connection region is disposed in a horizontal direction between the intermediate region and one of the base regions.

7. A method for manufacturing a semiconductor device, comprising the steps of:
   forming a semiconductor layer of a first conductivity type higher in resistance than a semiconductor substrate of the first conductivity type over a major surface of the semiconductor substrate;
   forming base regions of a second conductivity type in a predetermined region of a surface layer portion of the semiconductor layer;
   forming source regions of the first conductivity type in a predetermined region of a surface layer portion of the base region;
   forming source electrodes so as to contact the base regions and the source regions;
   forming gate electrodes over the semiconductor layer and the base regions through a gate insulating film interposed therebetween;
   forming a drain electrode over a back surface of the semiconductor substrate;
   forming a columnar intermediate region of the second conductivity type in a predetermined region of the surface layer portion of the semiconductor layer placed below each gate electrode electrode, the columnar intermediate region being disposed to not contact the base regions; and
   forming connection regions of the second conductivity type in predetermined regions of the surface layer portion of the semiconductor layer so as to contact the intermediate region and the base regions.

8. The method according to claim 7, wherein each connection region is formed in a horizontal direction between the intermediate region and one of the base regions.

* * * * *